(12) United States Patent
Kim et al.

(10) Patent No.: US 7,573,754 B2
(45) Date of Patent: Aug. 11, 2009

(54) NONVOLATILE MEMORY, APPARATUS AND METHOD FOR DETERMINING DATA VALIDITY OF THE SAME

(75) Inventors: Jin-kyu Kim, Seoul (KR); Song-ho Yoon, Yongin-si (KR); Nam-yoon Woo, Suwon-si (KR); Jae-hyuck Yoo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 315 days.

(21) Appl. No.: 11/727,073

(22) Filed: Mar. 23, 2007

(65) Prior Publication Data
US 2007/0297265 A1 Dec. 27, 2007

(30) Foreign Application Priority Data
Jun. 27, 2006 (KR) .................... 10-2006-0058219

(51) Int. Cl.
G11C 7/06 (2006.01)
(52) U.S. Cl. ..................... 365/189.07; 365/230.03; 365/236
(58) Field of Classification Search ........... 365/189.07, 365/230.03, 236
See application file for complete search history.

(56) References Cited

U.S. PATENT DOCUMENTS

| | | | | |
|---|---|---|---|---|
| 5,381,379 A | * | 1/1995 | Fukumoto | 365/238.5 |
| 6,587,934 B2 | * | 7/2003 | Miura et al. | 711/154 |
| 7,076,601 B2 | * | 7/2006 | Miura et al. | 711/106 |
| 7,177,184 B2 | * | 2/2007 | Chen | 365/185.03 |
| 2005/0013154 A1 | | 1/2005 | Honda et al. | |

FOREIGN PATENT DOCUMENTS

| | | |
|---|---|---|
| JP | 2003-015929 A | 1/2003 |
| KR | 10-2001-0100793 A | 11/2001 |
| KR | 10-2002-0074830 A | 10/2002 |
| KR | 10-2005-0070672 A | 7/2005 |
| KR | 10-2006-0056440 A | 5/2006 |

* cited by examiner

Primary Examiner—Tuan T. Nguyen
(74) Attorney, Agent, or Firm—Sughrue Mion, PLLC

(57) ABSTRACT

A nonvolatile memory including a memory cell that stores data in a plurality of pages included in a block according to a voltage applied to a memory cell is provided. The nonvolatile memory includes a block that includes a first page including first data that stores data recorded by a user, and a second page including second data area that stores data recorded by a user, wherein the second page records count-information on states represented by a bit pair in the same position of the first data area and the second data area.

14 Claims, 9 Drawing Sheets

< STATE CHANGE OF SLOT IN WRITING DATA >

FIG. 7

< STATE CHANGE OF SLOT IN ERASING DATA >

NONVOLATILE MEMORY, APPARATUS AND METHOD FOR DETERMINING DATA VALIDITY OF THE SAME

CROSS-REFERENCE TO RELATED APPLICATION

This application is based on and claims priority from Korean Patent Application No. 10-2006-0058219 filed on Jun. 27, 2006, in the Korean Intellectual Property Office, the disclosure of which is incorporated herein in its entirety by reference.

BACKGROUND OF THE INVENTION

1. Field of the Invention

Apparatuses and method consistent with the present invention relate to a nonvolatile memory, and more particularly, safely determining whether data stored in a nonvolatile memory is valid.

2. Description of the Related Art

Generally, embedded systems such as electric home appliances, communication appliances, and set-top boxes widely employ a nonvolatile memory as a storage medium that processes and stores data.

Flash memory is a commonly used nonvolatile memory device that can electrically write or erase data. Flash memory is suitable for portable devices because of its advantages of lower power consumption than that of a magnetic disc memory, fast access time like a hard disc, and small size.

A basic mechanism for storing data bits in the nonvolatile memory is the memory cell. A memory cell includes a single transistor provided with a control gate, floating gate, source, and drain. Here, data bits are stored by manipulating the charge in the floating gate in order to change a threshold voltage of the memory cell. Also, the memory cell is read by applying the selected voltage via a word line of the control gate.

A general memory cell provides a function for storing two states via 1 bit. That is, the memory cell stores a "1" bit for a state where data does not exist, or a "0" bit referring to a state where data is stored.

Technology for storing a plurality of bits in one memory cell has been researched in order to produce a high-capacity storage device having a low cost per bit.

The technology for reducing the cost per bit in a nonvolatile memory was introduced to the IEEE as "A Multilevel-Cell 32 Mb Flash Memory" by M. Bauer, (ISSCC Digest of Technical Papers, pp. 132 and 133 on February, 1995), which includes a technology for providing a function of storing four states via two bits per memory cell.

The nonvolatile memory that stores four states via two bits per memory cell is called as a multilevel cell (hereinafter, referred to as MLC), which stores data bits corresponding to two pages via one memory cell. Two pages corresponding to one memory cell are respectively called an. Least Significant Bit (LSB) page and an Most Significant Bit (MSB) page. The data bit is stored in the LSB page first.

Figure 1:
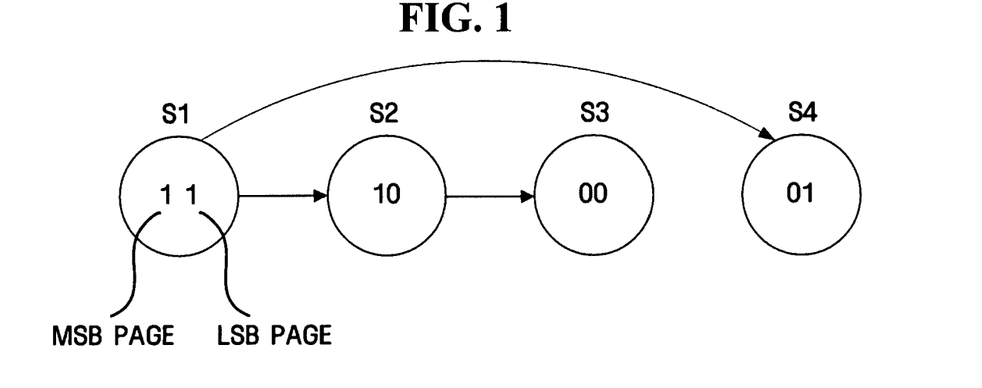
FIG. 1 depicts a state embodied by a memory cell of a related MLC nonvolatile memory.

In detail, the MLC nonvolatile memory has four states: S1, S2, S3, and S4, which are embodied as two bits as in FIG. 1. And each state includes a pair of data bits of the LSB page and the MSB page. When a block of the nonvolatile memory is erased, all memory cells in the block are in state S1. Here, if data bit is recorded in the LSB page, S1 is changed to S2, and, if data bit is recorded in the MSB page, S2 is changed to S3. The above steps are required in order so that S1 is changed to S4.

A nonvolatile-memory-based system may unexpectedly suffer from frequent power interruptions due to its characteristics. Therefore, the nonvolatile memory-based system needs a function for recovering data damaged or lost due to a power interruption.

Figure 2:
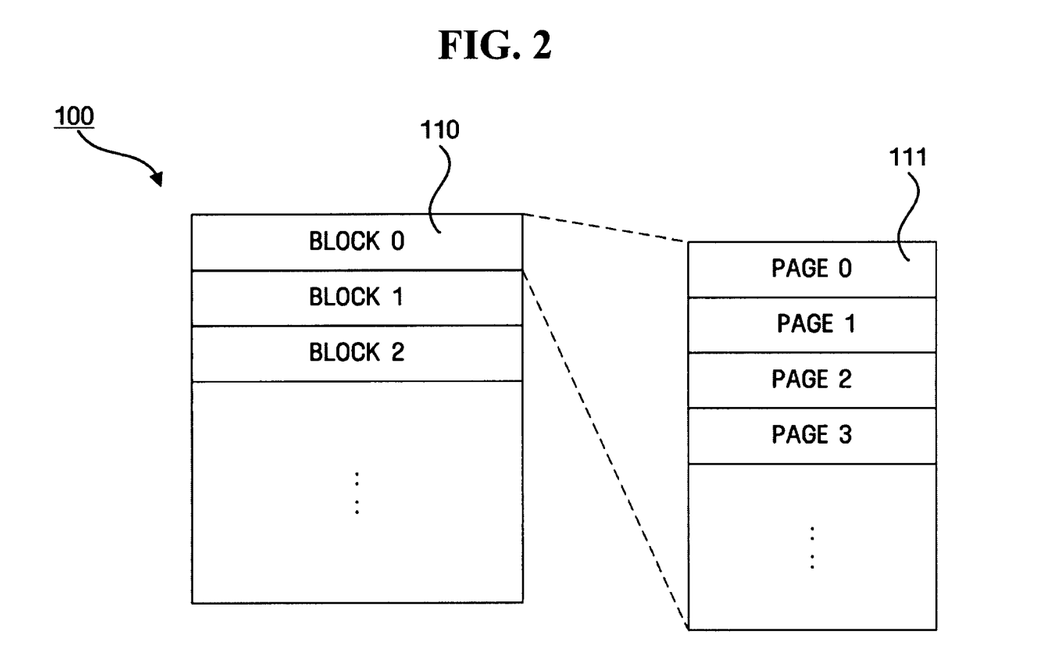
FIG. 2 depicts a structure of a related nonvolatile memory.

FIG. 2 depicts a structure of a general nonvolatile memory.

The general nonvolatile memory 100 includes a plurality of blocks 110 including a plurality of pages 111. Each block size may be 16 KB, 64 KB, 128 KB, or 256 KB, which is decided by the number of pages included in the block and the page size. Here, the block is an erase unit of the nonvolatile memory, and the page is a write unit.

If power is cut off during the process of recording data in the nonvolatile memory 100, data may be incompletely recorded (incomplete program state). If power is cut off during the process of erasing data recorded in nonvolatile memory 100, data to be recorded may be incompletely recorded (incomplete program state). Thus, when referring to the data recorded in the nonvolatile memory 100, the validity of the data has to be determined first.

According to related art, to determine whether data is valid if power is cut off in the process of recording data, a field where a value showing that the writing operation is complete is recorded is located in a spare area. When the data is successfully recorded in the data area, "writing complete" is indicated in the field. The validity of data is determined according to the value recorded in the field.

Also, to determine whether data is valid if power is cut off in the process of erasing data, a field where a value showing that the erase operation is complete is recorded is located in each block. When data is all erased in the data area, "erase complete" is indicated in the field. The validity of the data is determined according to the value recorded in the field.

Although a value corresponding to "erase complete" is recorded in each field according to the above-described method, it is impossible to completely detect invalid data. If values of each field still remain because data is erased from only the data area, invalid data can be detected. Since the above method has to perform a write operation twice (data-write operation and "write complete" recording) for one page, it is not suitable for a nonvolatile memory whose number of partial programs (NOP) is once.

Exempting the above method, validity of data can be determined using an inverse checksum. The lower the voltage of a cell included in the nonvolatile memory is, the higher the inverse checksum p.

The inverse checksum can be used to determine the validity of data. However, the inverse checksum method can be applied only when it is assumed that the lower the voltage of cell included in the nonvolatile memory is, the higher number is indicated. When the inverse checksum is used in MLC memory, where the above assumption is not applied, invalid data may be considered as valid data, which is a problem.

Several inventions, e.g., Korean Unexamined Patent No. 2005-070672: "Method for Address Mapping and Managing Mapping Information, and Flash Memory thereof", have been suggested. However, the above problem still remains to be solved.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

In view of the above, the present invention provides an apparatus and method for accurately determining the validity of incomplete data generated since power is cut off in a nonvolatile memory including a memory cell that stores data bits for a plurality of pages via a plurality of states embodied as at least two of bits.

According to an aspect of the present invention, there is provided a nonvolatile memory that stores data in a plurality of pages included in a block according to a voltage applied to a memory cell, the nonvolatile memory including the block that includes a first page including a first data that stores data recorded by a user, and a second page including a second data area that stores data recorded by a user, wherein the second page records count-information on states represented by a bit pair in the same position of the first data area and the second data area.

According to another aspect of the present invention, there is provided an apparatus for determining whether data of nonvolatile memory is valid, the apparatus including a nonvolatile memory which stores data in a first and second pages included in a block according to a voltage applied to a memory cell, a count unit which creates a first count-information by counting states represented by a bit pair in the same position of the first page and the second page, a control unit which stores the created first count information in the second page, and a validity-determining unit which determines whether the data is valid by comparing the stored first count information and second count information extracted from the first and second pages.

According to still another aspect of the present invention, there is provided a method of determining the validity of data of nonvolatile memory that stores data in first and second pages included in a block according to a voltage applied to a memory cell, the method including creating first count information by counting states shown by a bit pair in the same position of the first page and the second page, storing the created first count information in the second page, and determining whether the data is valid by comparing the stored first count information and second count information extracted from the first and second pages.

BRIEF DESCRIPTION OF THE DRAWINGS

The above and other aspects of the present invention will become apparent by describing in detail exemplary embodiments thereof with reference to the attached drawings, in which.

DETAILED DESCRIPTION OF THE INVENTION

Exemplary embodiments of the present invention will be described in detail with reference to the accompanying drawings.

The present invention and methods of accomplishing the same may be understood more readily by reference to the following detailed description of the exemplary embodiments and the accompanying drawings. The present invention may, however, be exemplary embodied in many different forms and should not be construed as being limited to the exemplary embodiments set forth herein. Rather, these exemplary embodiments are provided so that this disclosure will be thorough and complete and will fully convey the concept of the invention to those skilled in the art, and the present invention will only be defined by the appended claims. Like reference numerals refer to like elements throughout the specification.

Exemplary embodiments of the present invention are described hereinafter with reference to flowchart illustrations of user interfaces, methods, and computer program products. It will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded into a computer or other programmable data processing apparatus to cause a series of operational steps to be performed in the computer or other programmable apparatus to produce a computer implemented process such that the instructions that execute in the computer or other programmable apparatus provide steps for implementing the functions specified in the flowchart block or blocks.

Each block of the flowchart illustrations may represent a module, segment, or portion of code, which includes one or more executable instructions for implementing the specified logical function(s). It should also be noted that in some alternative implementations, the functions noted in the blocks may occur out of order. For example, two blocks shown in succession may in fact be executed substantially concurrently or the blocks may sometimes be executed in reverse order depending upon the functionality involved.

Figure 3:
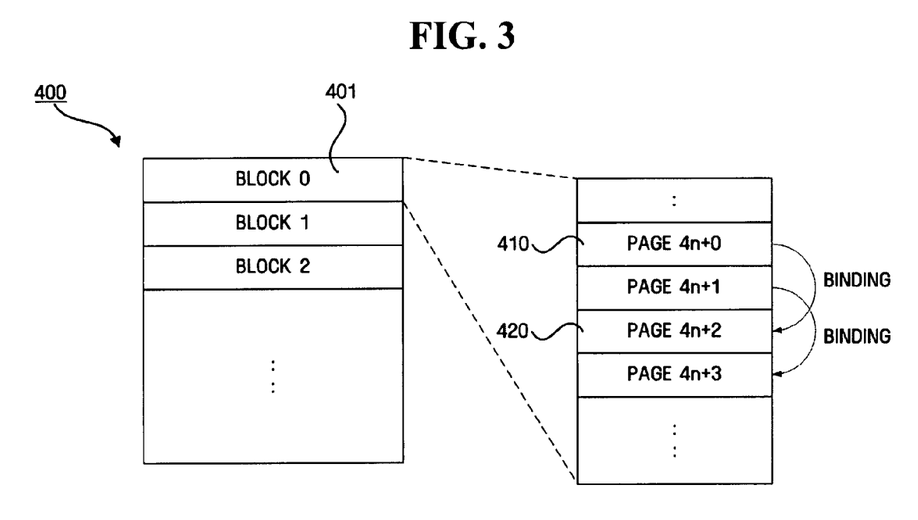
FIG. 3 depicts a structure of a nonvolatile memory according to an exemplary embodiment of the present invention.

FIG. 3 depicts a structure of a nonvolatile memory according to an exemplary embodiment of the present invention.

As illustrated in FIG. 3, a nonvolatile memory 400 includes a plurality of blocks 401 having a plurality of pages 410 and 420. In the exemplary embodiments of the present invention, the pages may refer to reading/writing units and the blocks may refer to erasing units.

The nonvolatile memory 400 is a multilevel cell (MLC) nonvolatile memory. The MLC nonvolatile memory includes a memory cell that stores data in a plurality of pages via a plurality of states exemplarily embodied as at least 2 bits. Hereinafter, a 2-level MLC nonvolatile memory will be described as an example.

The 2-level MLC nonvolatile memory includes a memory cell that stores data in two pages, i.e., a least significant bit (LSB) page and a most significant bit (MSB) page via four states embodied as at least 2 bits. The LSB page and MSB page where data bits are stored by the same memory cell are bound each other. Bound pages may be successively located or not. For example, a page 4n+0 and page 4n+2 may be bound and a page 4n+1 and page 4n+3 may be bound as illustrated in FIG. 3. Here, the page 4n+0 page and page 4n+1 correspond to the LSB pages, and the page 4n+2 page and page 4n+3 correspond to the MSB pages. Hereinafter, of the bound pages, the LSB pages are marked as a first page 410 and the MSB pages are marked as a second page 420.

The first page 410 and second page 420 are described in detail with reference to FIG. 4.

Figure 4:
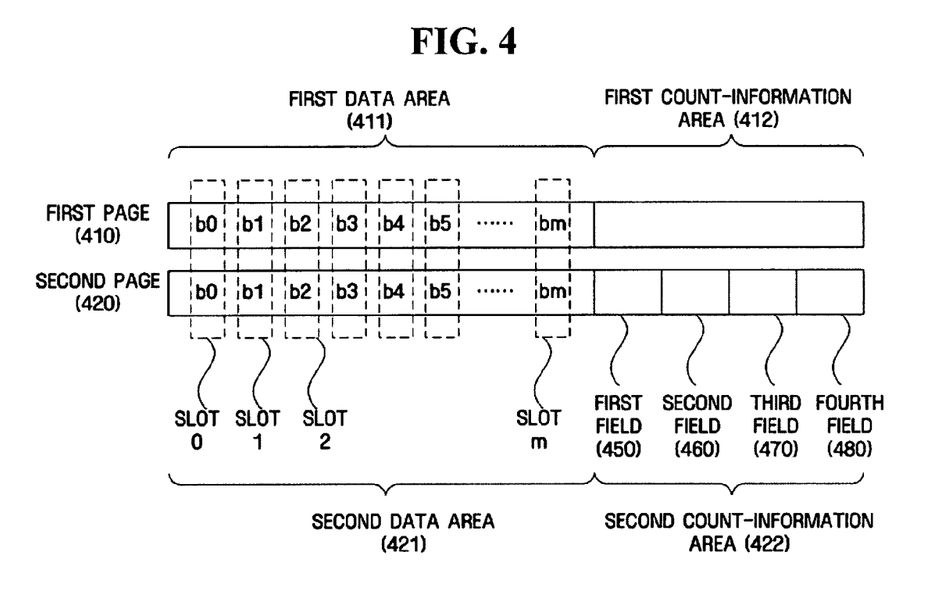
FIG. 4 depicts a first page and a second page according to an exemplary embodiment of the present invention.

FIG. 4 depicts the structure of the bound first page 410 and second page 420 according to an exemplary embodiment of the present invention.

As illustrated in FIG. 4, the first page 410 includes a first data area 411 and a first count-information area 412, and the second page 420 includes a second data area 411 and a second count-information area 422. Data bits to be recorded by a user are stored in the first and second data areas 411 and 421. A process of recording data bits in the bound first and second pages 410 and 420 will be described with reference to FIG. 5.

Figure 5:
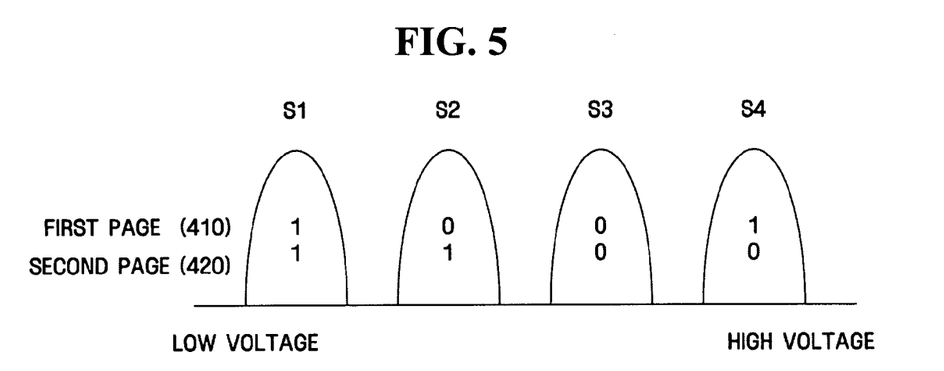
FIG. 5 depicts a change of a slot state based on a voltage applied to a memory cell of a nonvolatile memory according to an exemplary embodiment of the present invention.

FIG. 5 depicts a state change of data-bit pairs of the first and second pages 410 and 420 according to a voltage applied to a memory cell of a nonvolatile memory when data is recorded in the 2-level MLC nonvolatile memory.

In the 2-level MLC nonvolatile memory, the state exemplarily embodied by the memory cell is pairs of each data bit of the first and second pages 410 and 420. The data bit pair is 11 in a state where a block is erased. In the MLC nonvolatile memory, since data bits are stored from the first page 410, a data bit pair is 01 if data is stored in the first page 410. If data bit is also stored in the second page 420, the data bit pair is 00. Hereinafter, a data bit pair located at the same place in the bound first and second pages 410 and 420 are called as a slot.

In the second count-information area 422 of the second page 420, count-information for determining whether data stored in the first and second data areas 411 and 421 is valid. Here, the count-information includes the number of slots having the same state.

As above-described in FIG. 5, in the 2-level MLC nonvolatile memory, the slot can have four states using data bits of the first and second pages 410 and 420. That is, the slot can have a first state S1 in which each data bit of the first and second pages 410 and 420 are 1 and 1, a second state S2 in which each data bit of the first and second pages 410 and 420 are 0 and 1, a third state S3 in which each data bit of the first and second pages 410 and 420 are 0 and 0, and a fourth state S4 in which each data bit of the first and second pages 410 and 420 are 1 and 0.

Accordingly, the count-information recorded in the second count-information area 422 may include each number of slots having the first-state, the second-state, the third-state, and the fourth-state. The count-information stored in the second count-information area 422 is classified into each state, and the second count-information may be classified into several fields corresponding to each state. For example, the second count-information area 422 may include a first field 450 in which the number of slots having the first state, a second field 460 in which the number of slots having the second state, a third field 470 in which the number of slots having the third state, and a fourth field 480 in which the number of slots having the fourth state.

As mentioned above, the count-information may be recorded in the second count-information area 422 because a state change of the data bit included the second count-information area 422 has a regularity in a process of writing or erasing data, which will be described in detail with reference to FIGS. 6 and 7.

Figure 6:
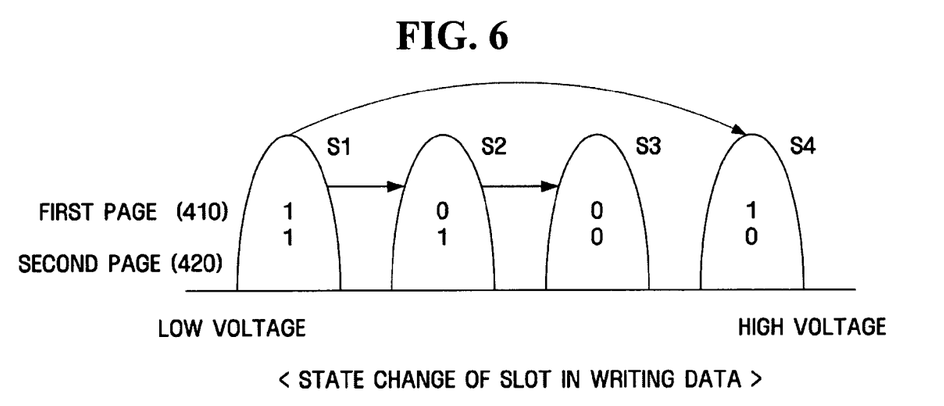
FIG. 6 depicts a change of a slot state when data is recorded in a nonvolatile memory according to an exemplary embodiment of the present invention.

FIG. 6 depicts a state change of data bits included in the first and second pages 410 and 420 according to a voltage applied to a memory cell of a nonvolatile memory when data is recorded in a nonvolatile memory 400.

Figure 7:
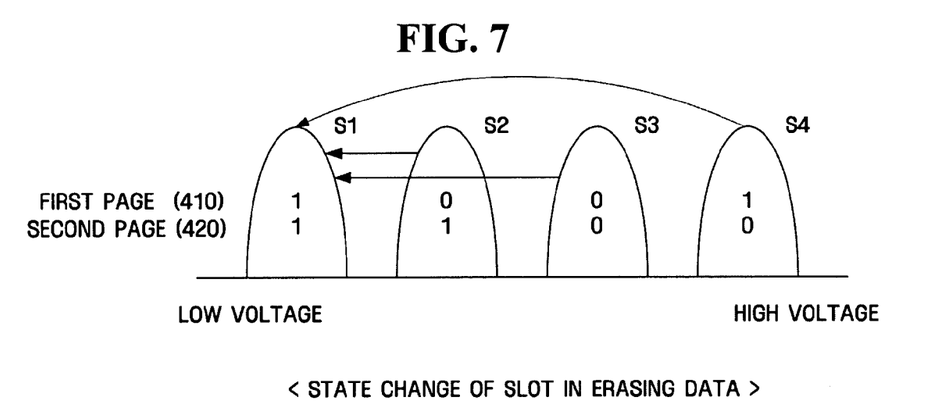
FIG. 7 is a view illustrating a change of a slot state when data is deleted in a nonvolatile memory according to an exemplary embodiment of the present invention.

FIG. 7 depicts a state change of data bits included in the first and second pages 410 and 420 according to a voltage applied to a memory cell of a nonvolatile memory when data is erased from a nonvolatile memory 400.

Referring to FIGS. 6 and 7, a slot having the first state S1 when data is not recorded. In this state, if a voltage is applied to the memory cell, 0 is recorded in each bit of the slot according to the voltage.

In the first page 410, the following situations may happen if power is cut off in the process of erasing data. If power is cut off while a cell state is changed from the fourth state to the first state through the erase operation, the state of bits included in the first page 410 may be changed from 1 to 0 or remain as 1. If power is cut off while a cell state is changed from the third state to the first state through the erase operation, the state of bits included in the first page 410 may be changed from 0 to 1 or remain as 0.

Thus, the state of data bits included in the first page 410 may be changed from 1 to 0, or from 0 to 1 through the erase operation. In a case of the first page 410, it is hard to determine whether the state of data bits is changed to the specified direction if power is cut off during the erase operation. When the count-information is recorded in the first count-information area 412, although an error occurs in the data bits recoded in the data area and/or the count-information area because the power is cut off in the erase operation, the count-information extracted from the data areas and the count-information of the first count-information area 412 may be identical. In this case, the data bits recorded in the data areas 411 and 412 are not valid; however, it may be determined that the data bits are valid because the count-information are identical.

However, the state of data bits included in the second page 420 remains as 1, or may be changed from 1 to 0 if power is cut off in the writing operation, and remains as 0 or may be changed from 0 to 1.

Thus, the state of data bits included in the second page 420 may be changed from 1 to 0 in the writing operation, and from 0 to 1 in the erase operation. In the case of the second page 420, it can be determined that the state change of the bit has regular direction. When the count-information is recorded in the second count-information area 422, although error occurs in data bits recoded in the data area and/or count-information area because the power is cut off in the writing operation, the count-information extracted from the data area and the count-information of the second count-information area 422 are not identical.

In the process of recording data, the state of the data bits included in the second pages 420 can only be changed from 1 to 0. If error occurs in the process of recording data, 0 is not recorded in the bit in which 0 can only be recorded, and the bit remains as 1. In other words, although error occurs in the count-information, the number of slots indicated by each field only increases from the desired number of slots; but the number of slots does not decrease. Accordingly, the count-information extracted from the data area is not identical with the count-information of the second count-information area 422. As a result, it is possible determine whether the data is valid by comparing the count-information extracted from the data area and the count-information of the second count-information area 422.

Similarly, when count-information is recorded in the second count-information area 422, even though data of the nonvolatile memory 400 is incompletely erased, it is possible to determine whether the remaining data bits are valid. Referring to FIG. 7, the state of the data bits included in the second page 420 can only be changed from 0 to 1 in the process of erasing data. Therefore, if an error occurs in the erase operation, the bit cannot be 1, and remains 0. That is, if the data is incompletely erased, the number of slots indicated by each field increases from the number of the recorded slots. Accordingly, it is possible determine whether the data is valid by comparing the count-information extracted from the data areas and the count-information of the second count-information area 422.

Figure 8:
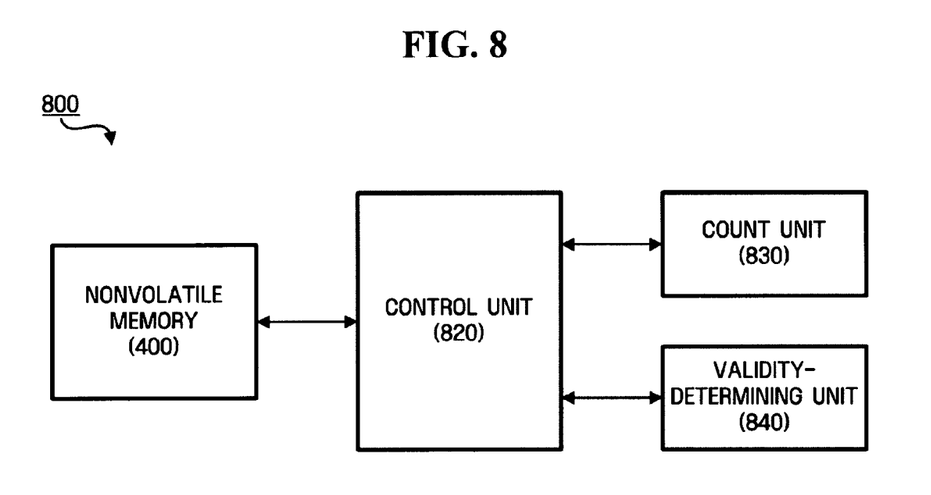
FIG. 8 depicts a structure of an apparatus that determines data validity of a nonvolatile memory according to an exemplary embodiment of the present invention.

FIG. 8 depicts a structure of an apparatus that determines whether data of a nonvolatile memory is valid (hereinafter, referred to as a "data-validity-determining apparatus") according to an exemplary embodiment of the present invention.

Referring to FIG. 8, a data-validity-determining apparatus 800 includes a nonvolatile memory 400, a count unit 830, a control unit 820, and a validity-determining unit 840.

The nonvolatile memory 400 can be understood as the nonvolatile memory 400 described in FIG. 4. Accordingly, the nonvolatile memory 400 illustrated in FIG. 8 has the same structure as the nonvolatile memory 400 described in FIG. 4. Elements of the nonvolatile memory 400 illustrated in FIG. 8 is also the same as the nonvolatile memory 400 described in FIG. 4.

The count unit 830 classifies data to be recorded in the bound first and second pages of the nonvolatile memory 400 into slots, and counts the number of slots having the same state. That is, the count unit 830 respectively counts the number of slots having the first state, the second state, the third state, and the fourth state. The count-information generated by the count unit 830 is provided to the control unit 820.

When referring to the data recorded in the data areas 411 and 421 of the nonvolatile memory 400, the count unit 830 extracts the count-information from the data. That is, count unit 830 extracts the count-information from the data by counting the number of slots having the same state. The count-information extracted by the count unit 830 is provided to the validity-determining unit 840.

The control unit 820 changes a state of the memory cell by controlling an amount of voltage applied to the memory cell of the nonvolatile memory 400 in order to store data bits in the bound first and second pages 410 and 420. Here, the control unit 820 stores data bits in the first page 410, and then stores data bits in the second page 420. When the data bits are stored in the second page 420, the control unit 820 records data to be referred to in the second data area 421, and records the count-information generated by the count unit 830 in the second count-information area 422.

When referring to the data recorded in the nonvolatile memory 400, the validity-determining unit 840 determines whether the data is valid. Here, the validity-determining unit 840 determines whether the data is valid by comparing the count-information extracted from the data area and the count-information of the second count-information area 422.

When the count-information, i.e., each number of slots having the first-state, the second-state, the third-state, and the fourth-state, is extracted from the data of the data areas 411 and 421 by the above-described count unit 830, the validity-determining 840 compares the numbers of slots of each state in the extracted count-information and the count-information of the second count-information area 422.

If each number of slots classified into each state of the extracted count-information is identical with that of the count-information of the second count-information area 422, the validity-determining unit 840 determines the data is valid. For example, the extracted count-information shows that there are two first-state slots, one second-state slot, one third-state slot, and two fourth-state slots. The count-information of the second count-information area 422 shows that there are two first-state slots, one second-state slot, one third-state slot, and two fourth-state slots. In this case, each number of slots classified into each state of the extracted count-information is identical with that of the count-information of the second count-information area 422. Therefore, the validity-determining unit 840 determines the data is valid.

If each number of slots classified into each state of the extracted count-information is not identical with that of the count-information of the second count-information area 422, the validity-determining unit 840 determines the data is not valid. For example, when the number of slots having the same state is compared for each state in two count-information, if the number of first-sate slots is identical and the number of second-state slots is not identical, the validity-determining unit 840 determines the data is not valid.

Figure 9:
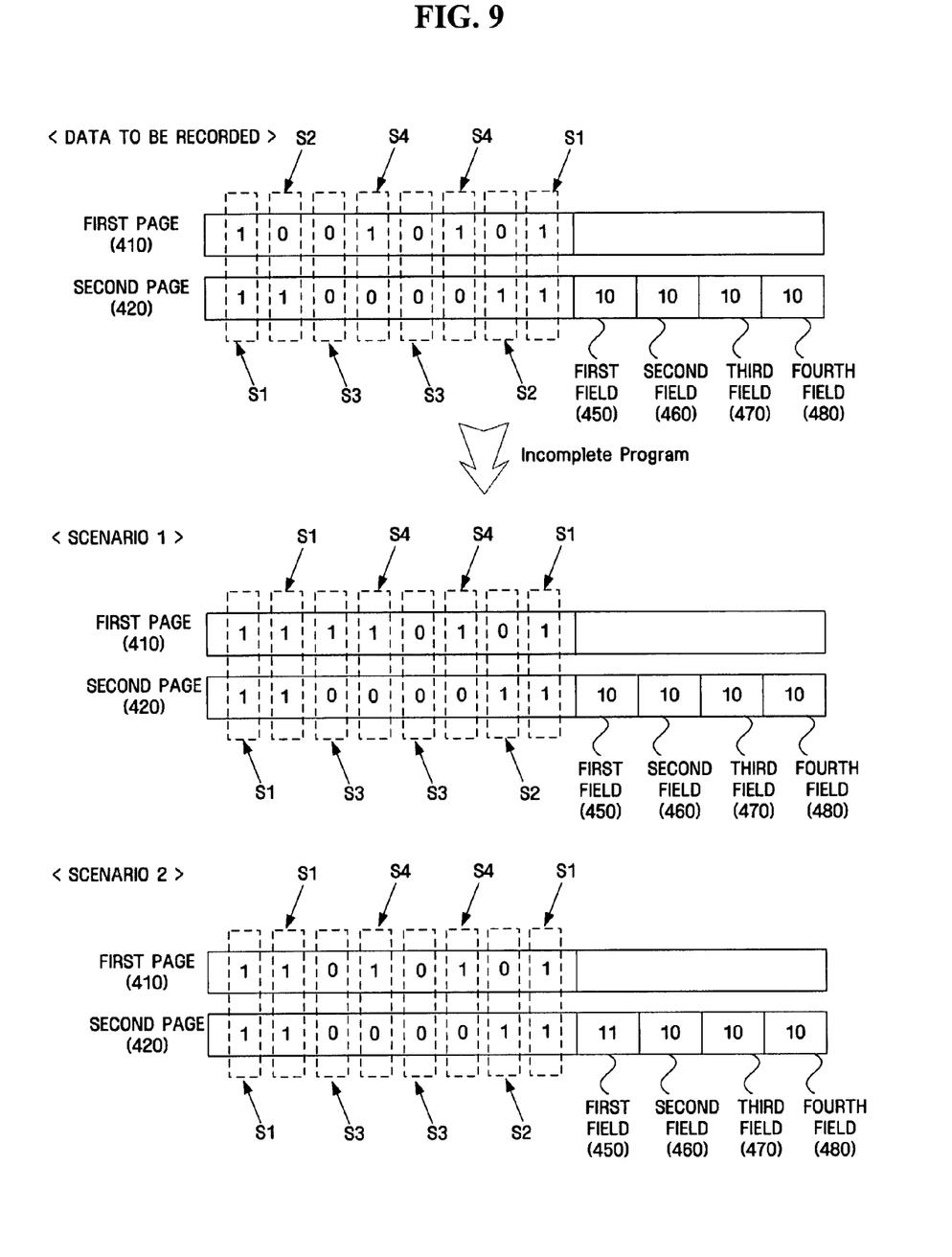
FIG. 9 illustrates a method of determining validity of data in which an error occurs since power is cut off in the process of writing data to a flash memory.
Figure 10:
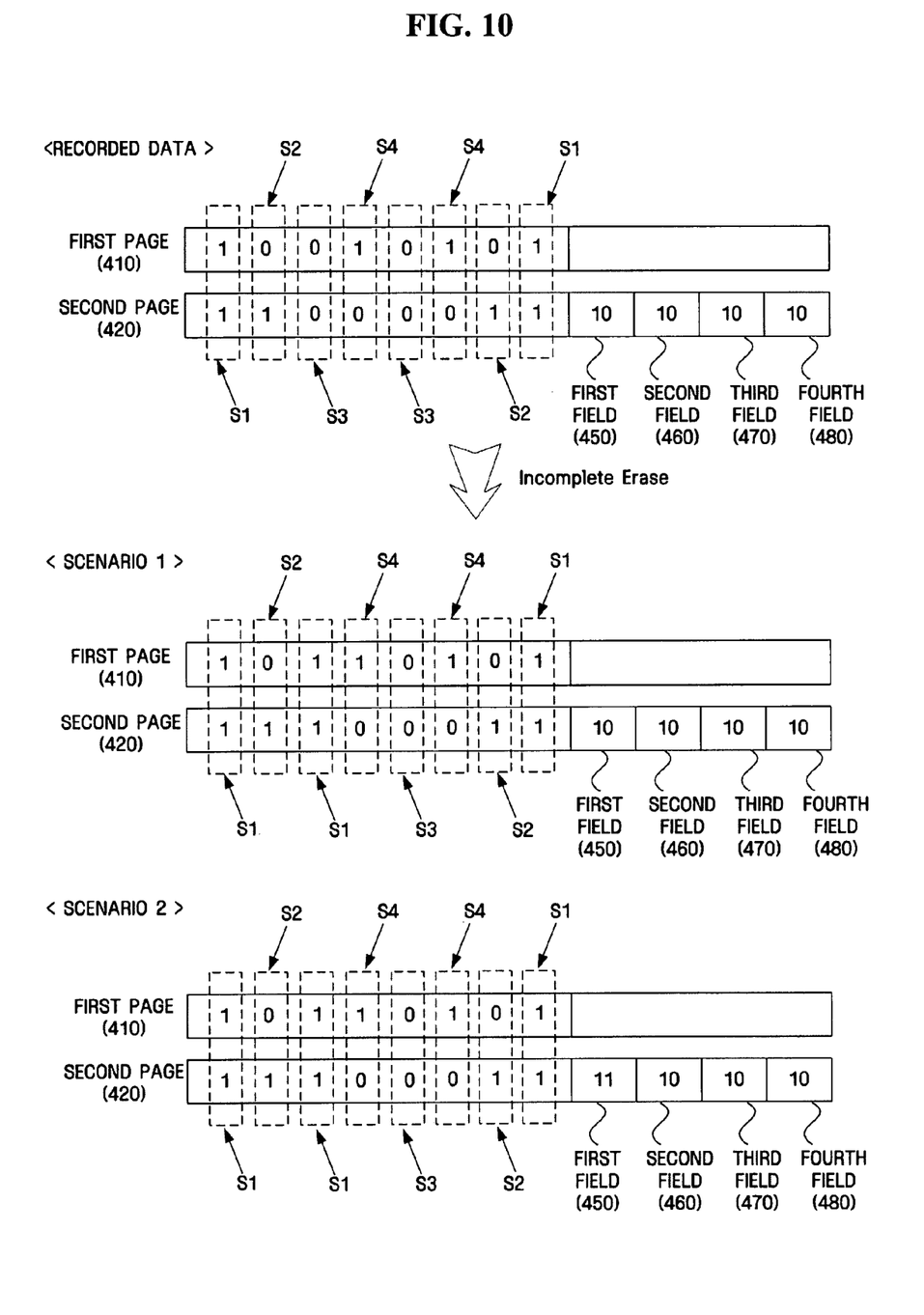
FIG. 10 illustrates a method of determining validity of data in which an error occurs since power is cut off in the process of erasing data from a flash memory.

A method of determining whether data in which an error occurs since power is cut off in the process of writing or erasing data with reference to FIGS. 9 and 10.

FIG. 9 illustrates a method of determining whether data, in which an error occurs since power is cut off in the process of writing data to the nonvolatile memory 400, is valid.

Referring to data to be recorded in the nonvolatile memory 400 of FIG. 9, each number of slots having the first-state, second-state, third-state, or fourth-state is respectively two.

When power is cut off in a process of writing the data in the nonvolatile memory 400, error may occur in data bits recorded in the first and second data areas 411 and 421 or count-information recorded in the second count information area 422. Referring to the first and second data areas 411 and 421 of scenario 1, a second slot, which should be recorded as the second state, remains as the first state. As a result, count-information given by the data bits recorded in the current data area is not identical with count-information recorded in the second count information area 422. In detail, the number of the first state slots, of the count-information given by the data bits recorded in the current data area, is 3, while the number of the first state slots, of the count-information recorded in the second count-information area 422, is 2; therefore each number of the first-state slots is not identical. In this case, it may be determined that the data bit recorded in the data area is not valid.

When power is cut off in the process of writing the data, errors may occur in both data bits recorded in the first and second data areas and count-information recorded in the second count-information area 422. Scenario 2 illustrates data of the above case.

Referring to a data area of scenario 2, a second slot, which should be recorded as the second state, remains as the first state. In the second count-information area 422, 0 is not recorded in one bit of the field, in which the number of the first state slots is recorded, and the bit remains as 1.

In this scenario, the number of the first state slots of the count-information given by the data bits recorded in the current data area is identical with that of the count-information recorded in the second count-information area 422. However, each number of slots having the second-state of each count-information is not identical. Thus, it may be determined that the data bit recorded in the data area is not valid.

FIG. 10 illustrates a method of determining whether data in which an error occurs since power is cut off in the process of erasing data from the nonvolatile memory 400 is valid.

Referring to data recorded in the nonvolatile memory 400 of FIG. 10, each number of slots having the first-state, the second-state, the third-state, and the fourth-state is respectively two. If power is cut off in the process of erasing data from the nonvolatile memory 400 storing the data, data bits of a data area and/or count-information area are not completely erased.

Scenario 1 illustrates a case where data bits of a data area are incompletely erased when power is cut off in the process of erasing data. Referring the second count-information area 422 of scenario 1, the count-information is not erased, while only the second slot having the second state is changed into the first state, which shows that the count-information given by the data bits recorded in the current data area is not identical with the count-information recorded in the second count-information area 422. In detail, the number of the first state slots, of the count-information given by the data bits recorded in the current data area, is 3, while the number of the first state slots, of the count-information recorded in the second count-information area 422, is 2; therefore each number of slots having the first-state is not identical. In this case, it may be determined that the data bit recorded in the data area is not valid.

Scenario 2 illustrates all data bits of both the data area and the second count-information area 422 are incompletely erased.

Referring to the data area of case 2, only the third slot is changed into 11, The second count-information area 422 shows that the first field 450 is changed into 11. In this case, the number of the first and second state slots of the count-information given by the data bits recorded in the current data area is identical with that of the count-information recorded in the second count-information area 422. However, each number of slots having the third-state or fourth-state of each count-information is not identical. Thus, it may be determined that the data bit recorded in the data area is not valid.

Figure 11:
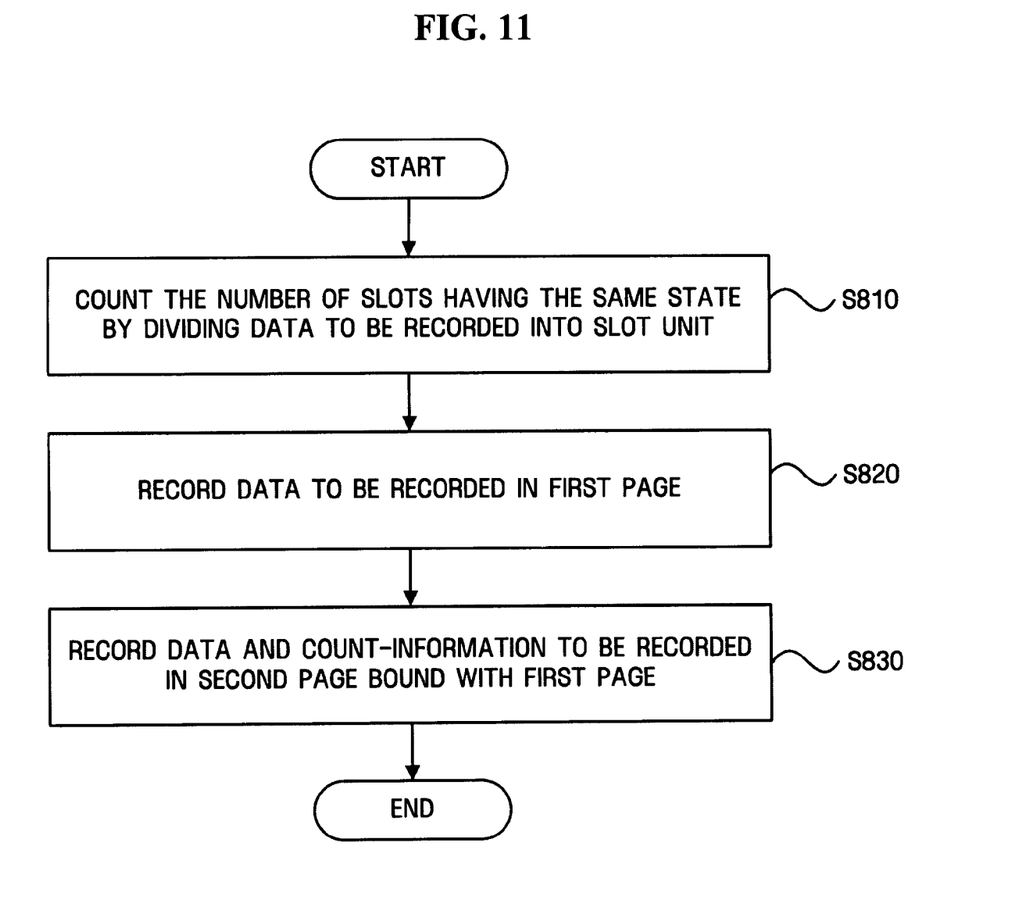
FIG. 11 is a flowchart showing a method of storing a data bit according to an exemplary embodiment of the present invention.

FIG. 11 is a flowchart showing a method of storing data in the nonvolatile memory 400 according to an exemplary embodiment of the present invention.

The count unit 830 divides data to be recorded in the nonvolatile memory 400 into slot units, and counts the number of slots having the same state (S810). That is, the count unit 830 counts each number of slots having the first-state, the second-state, the third-state, and the fourth-state respectively.

When the count-information is generated by the count unit 830, the control unit 820 first records data in the first page 410 (S820). That is, the control unit 820 records the data in the first data area 411.

Then, the control unit 820 records data in the second page 420 bound with the first page 410 (S830). That is, the control unit 820 records the data in the second data area 421, recording count-information generated by the count unit 830 in the second count-information area 422 by each state. For example, the control unit 820 records the number of slots having the first state in the first field 450, the number of slots having the second state in the second field 460, the number of slots having the third state in the third field 470, and the, number of slots having the fourth state in the fourth field 480.

Figure 12:
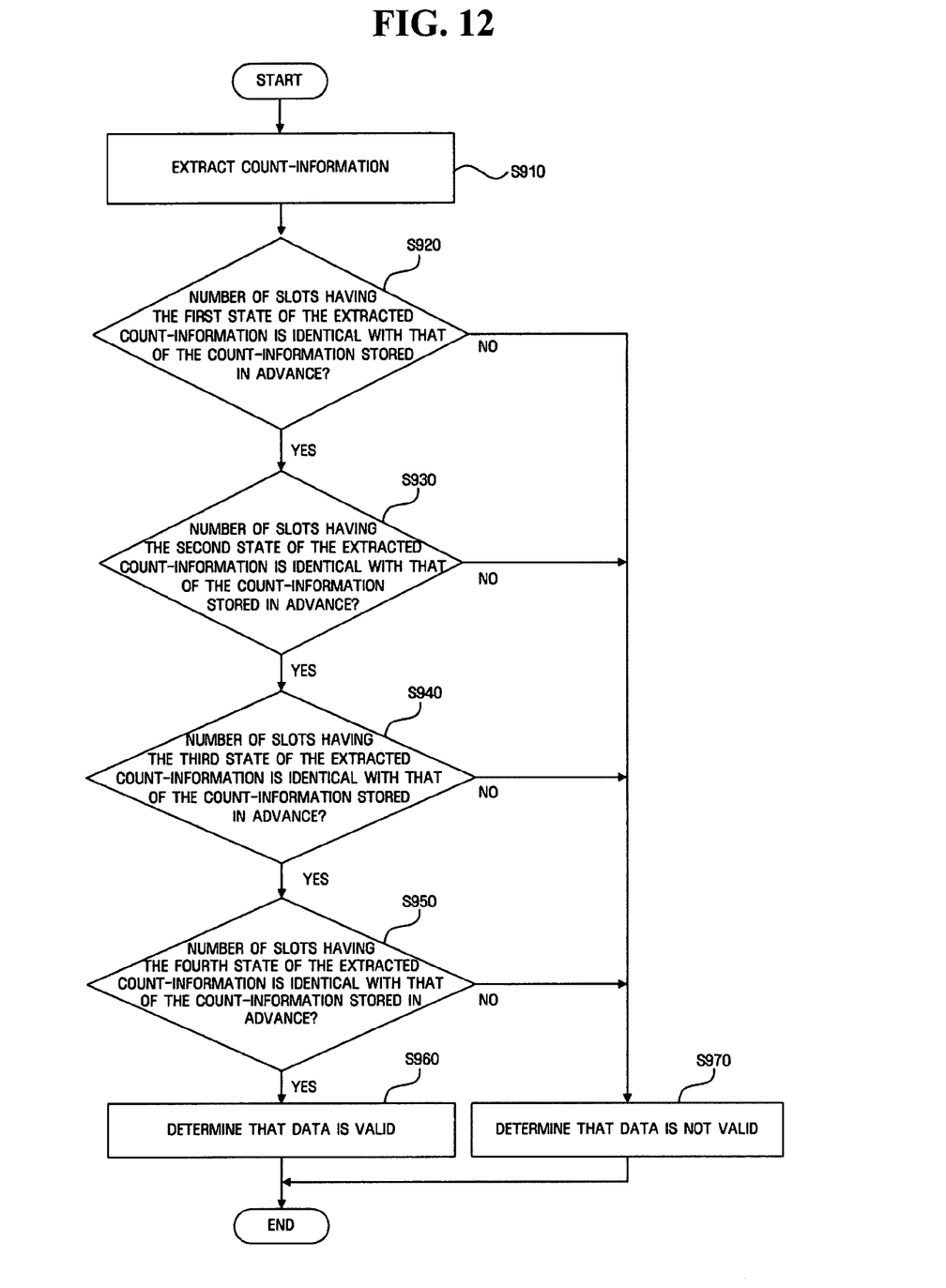
FIG. 12 is a flowchart showing data validity of a nonvolatile memory according to an exemplary embodiment of the present invention.

FIG. 12 is a flowchart showing the validity of data of the nonvolatile memory 400 according to an exemplary embodiment of the present invention.

When referring to the data recorded in the nonvolatile memory 400, the count unit 830 extracts the count-information from the data (S910). That is, count unit 830 counts each number of slots having the first-state, the second-state, the third-state, and the fourth-state respectively.

Then, the validity-determining unit 840 compares each number of slots classified into each state of the count-information extracted from the data area, and that of the count-information of the second count-information area 422 in turn.

If every number of slots classified into each state of the extracted count-information is identical with that of the count-information of the second count-information area 422, the validity-determining unit 840 determines the data is valid. In detail, the validity-determining unit 840 determines whether the number of slots having the first state of each count-information is identical (S920). In the determined result, if the number of slots having the first state of each count-information is identical ("YES" in S920), the validity-determining unit 840 determines whether the number of slots having the second state of each count-information is identical (S930). In the determined result, if the number of slots having the second state of each count-information is identical ("YES" in S930), the validity-determining unit 840 determines whether the number of slots having the third state of each count-information is identical (S940). In the determined result, if the number of slots having the third state of each count-information is identical ("YES" in S940), the validity-determining unit 840 determines whether the number of slots having the fourth state of each count-information is identical (S950). In the determined result, if the number of slots having the fourth state of each count-information is identical ("YES" in S950), the validity-determining unit 840 determines the data is valid (S960). For example, each number of slots having the first-state, second-state, third-state, or fourth-state is respectively two in the count-information extracted by the count unit 830. And, referring to the count-information recorded in the second count-information area 422, each number of slots having the first-state, second-state, third-state, or fourth-state is respectively two. In this case, each number of slots having the first-state, second-state, third-state, or fourth-state is identical. Accordingly, the validity-determining unit determines the data is valid.

While comparing each number of slots classified into each state of each count-information, if any one of the numbers of slots classified into each state of each count-information is not identical ("NO" in S920), ("NO" in S930), ("NO" in S940), and ("NO" in S950), the validity-determining unit 840 determines the data is not valid. For example, the extracted count-information shows that there are two first-state slots, two second-state slots, three third-state slots, and one fourth-state slot. And, referring to the count-information recorded in the second count-information area 422, each number of slots having the first-state, second-state, third-state, or fourth-state is respectively two. In this case, each number of slots having the first-state and second-state is identical. However, each number of slots having the third-state and fourth-state of each count-information is not identical. Therefore, the validity-determining unit 840 determines the data is not valid.

In the above-described exemplary embodiment, 2-level MLC nonvolatile memory was explained as an example, but the present invention is not limited thereto; accordingly, the present invention can be applied to MLC nonvolatile memory of more than 2-level.

Figure 13:
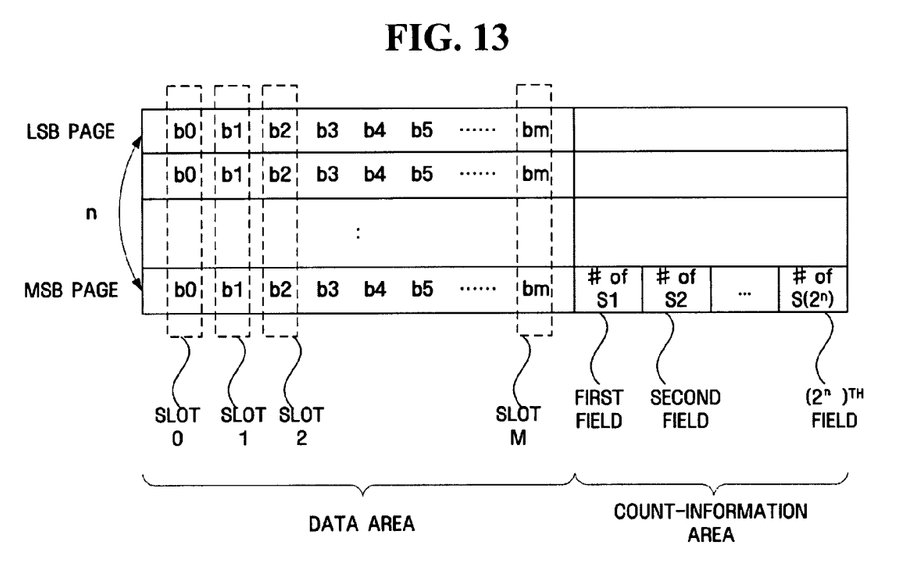
FIG. 13 illustrates a part of the structure of an MLC nonvolatile memory according to an exemplary embodiment of the present invention.

FIG. 13 illustrates a part of the structure of n-level MLC nonvolatile memory according to an exemplary embodiment of the present invention.

The n-level MLC nonvolatile memory stores data bits in n pages according to a voltage applied to a memory cell. Here, a slot includes n bits, and may have $2^n$ states. Count-information including the number of slots having the same state is recorded in the count-information area of the MSB page. When data is recorded in the MSB page, a state of bits can only be changed from 1 to 0. The count-information area of the MSB page is divided into 2n fields in which count-information can be stored. For example, the number of slots having the first state is stored in the first field and the number of slots having the $(2^n)^{th}$ state is stored in the $(2^n)^{th}$ field.

As described above, the nonvolatile memory, apparatus and method for determining data validity of the same according to the exemplary embodiments of the present invention produces one or more effects described below.

Even if power is cut off in a process of recording data bits in the nonvolatile memory, the exemplary embodiment of the present invention can easily determine whether the recorded data bit is valid.

It is possible to determine data validity without a number of partial programs (NOP) limitation.

Since only the number of slots having the same state is recorded, it is possible to use a space of the nonvolatile memory more efficiently than the process of recording metadata.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nonvolatile memory which stores data in a plurality of pages included in a block according to a voltage applied to a memory cell, the nonvolatile memory comprising:
    a block comprising a first page comprising a first data area which stores data recorded by a user, and a second page comprising a second data area which stores data recorded by a user,
    wherein the second page records count-information on states represented by a bit pair in a first position of the first data area and a corresponding first position of the second data area.

2. The memory of claim 1, wherein the second page comprises bits that can only be changed from 1 to 0 in a process of recording data, and can only be changed from 0 to 1 in a process of erasing data.

3. The memory of claim 1, wherein the bit pair is subsequently changed in an order of 11, 01, 00, and 10.

4. An apparatus for determining whether data of nonvolatile memory is valid, the apparatus comprising:
    a nonvolatile memory which stores data in a first page and a second page included in a block according to a voltage applied to a memory cell;
    a count unit which creates a first count-information by counting states represented by a bit pair in a first position of the first page and a corresponding first position of the second page;
    a control unit which stores the created first count-information in the second page; and
    a validity-determining unit which determines whether the data is valid by comparing the stored first count-information and second count-information extracted from the first and second pages.

5. The apparatus of claim 4, wherein the second page comprises bits that can only be changed from 1 to 0 in a process of recording data, and can only be changed from 0 to 1 in a process of erasing data.

6. The apparatus of claim 4, wherein the first page comprises a first data area that stores the first count-information area and data recorded by a user, and the second page comprises a second count-information area in which the first count-information is recorded and a second data area that stores data recorded by the user.

7. The apparatus of claim 6, wherein the count unit generates the second count-information by counting states represented by the bit pair of a second position in the first data area and a corresponding second position in the second data area.

8. The apparatus of claim 7, wherein the validity-determining unit determines whether the data stored in the first and second data areas is valid, if the first count-information and the second count-information are identical.

9. The apparatus of claim 4, wherein the bit pair is subsequently changed in an order of 11, 01, 00, and 10.

10. A method of determining whether data of nonvolatile memory is valid, in the nonvolatile memory that stores data in a first page and a second page included in a block according to a voltage applied to a memory cell, the method comprising:
    creating first count-information by counting states represented by a bit pair in a first position of the first page and a corresponding second position of the second page;
    storing the created first count-information in the second page; and
    determining whether the data is valid by comparing the stored first count-information and second count-information extracted from the first and second pages.

11. The method of claim 10, wherein the second page comprises bits that can only be changed from 1 to 0 in a process of recording data, and bits that can only be changed from 0 to 1 in a process of erasing data.

12. The method of claim 10, wherein the first page comprises a first data area that stores the first count-information area and data recorded by a user, and the second page comprises a second count-information area in which the first count-information is recorded and the second data area that stores data recorded by the user.

13. The method of claim 12, wherein the determining of data validity comprises:
    generating the second count-information by counting states represented by the bit pair of a second position in the first data area and a corresponding second position of the second data area; and
    determining the data stored in the first and second data areas to be valid if the first count-information and the second count-information are identical.

14. The method of claim 10, wherein the bit pair is subsequently changed in an order of 11, 01, 00, and 10.

* * * * *